United States Patent
Baek et al.

[11] Patent Number: 5,855,669
[45] Date of Patent: Jan. 5, 1999

[54] METHOD FOR FABRICATING GRATING COUPLER

[75] Inventors: Jong-Hyeob Baek; Bun Lee, both of Daejeon, Rep. of Korea

[73] Assignee: Electronics And Telecommunications Research Institute, Daejeon, Rep. of Korea

[21] Appl. No.: 842,872

[22] Filed: Apr. 17, 1997

[30] Foreign Application Priority Data

Dec. 21, 1996 [KR] Rep. of Korea .................. 96-69403

[51] Int. Cl.$^6$ .................................................. C30B 25/16
[52] U.S. Cl. ..................... 117/89; 117/101; 117/108; 117/953
[58] Field of Search .................. 107/89, 101, 108, 107/953

[56] References Cited

U.S. PATENT DOCUMENTS

| | | | |
|---|---|---|---|
| 4,624,000 | 11/1986 | Streifer et al. | 372/45 |
| 5,488,504 | 1/1996 | Worchesky et al. | 359/248 |
| 5,528,707 | 6/1996 | Sullivan et al. | 385/2 |

OTHER PUBLICATIONS

Wang et al, "Critical Layer Thickness of Strained–Layer InGaAs/GaAs Multiple Quantum Wells . . . " Journal of Electronic Materials, vol. 22, No. 11 1993 pp. 1365–1368.

Hake et al, "Initial Results for In GaAs Films Grown as InGaAs Substrates", Journal Vacuum Science and Technology B vol. 13(2) Mar./Apr. 1995 pp. 678–680.

Kui et al "Thermal Relaxation in Strained InGaAs/GaAs Heterostructure," Journal of Electronic Materials, vol. 20, No. 10 1991 pp. 827–831.

Kapon, E., et al. *Photoresist gratings on reflecting surfaces*, J. Appl. Phys., vol. 53, No. 3, pp. 1387–1390, Mar., 1982.

Chang, K.H., et al. *Crosshatched surface morphology in strained III–V semiconductor films*, J. Appl. Phys., vol. 67, No. 9, pp. 4093–4098, May 1, 1990.

Yoon, M., et al. *Evolution of the surface cross–hatch pattern in $In_xGa_{x-1}As/GaAs$ layers grown by metal–organic chemical vapor deposition*, Appl. Phys. Lett., vol. 68, No. 1, pp. 16–18, Jan. 1, 1996.

H. G. Hunsperger, *Integrated Optics: Theory and Technology*, 3rd Edition in Springer series in Optical Sciences, vol. 33, edited by Theodor Tamir, New York, 1991, pp. 100–103.

*Primary Examiner*—Robert Kunemund
*Attorney, Agent, or Firm*—Cohen, Pontani, Lieberman & Pavane

[57] ABSTRACT

A grating coupler is formed by growing an optical waveguide layer on a substrate by an epitaxial growing process such as a metalorganic chemical vapor deposition and a molecular beam deposition. The optical waveguide layer has a surface on which a cross-hatch pattern serving as the grating is continuously formed. The optical waveguide layer is formed with a material having a reflective index greater than a reflective index of the substrate or an atmosphere. Specifically, the substrate is formed with GaAs and the optical waveguide layer is formed with InGaAs. Further, the substrate is an on-substrate having an orientation coinciding with a [100] plane, so as to form the optical waveguide layer having continuous cross-hatch patterns on the surface thereof. The spacing between the cross-hatch patterns can be varied according to variation of a growth temperature of the optical waveguide layer.

5 Claims, 2 Drawing Sheets

METHOD FOR FABRICATING GRATING COUPLER

BACKGROUND OF THE INVENTION

1. Field of the Invention

The present invention relates to a method for fabricating a grating coupler used for an optical communication system, and more particularly a method for fabricating a grating coupler having an epitaxial layer of which surface has a cross-hatch pattern that serves as a grating, in which the epitaxial layer is grown by an epitaxial growing process using a material having a lattice constant greater than that of a substrate or an atmosphere.

2. Description of the Related Art

In general, a grating coupler is an optical coupler fabricated by artificially forming the grating on a material used for a semiconductor or dielectric optical waveguide, so as to transfer an incident beam from the surface through the optical waveguide. A known method for fabricating the grating grows a thin film on a substrate to be used for the waveguide, and forms the grating on the thin film by the masking and etching process. However, in the case where a spacing between the gratings is very narrow, an optical interference exposure process has been used for fabricating the same.

Referring to FIG. 1, there is shown a cross-sectional view of the grating coupler according to prior art. As illustrated, an optical waveguide layer 2 is formed on a substrate 1. Then, a plurality of gratings 3 are formed uniformly on the optical waveguide layer 2 by the conventional masking and etching process. It is generally noted that a material forming the optical waveguide layer 2 should have a greater reflective index than the reflective index of the substrate 1. Furthermore, a periodicity Δ of the gratings (i.e., a spacing between the gratings) and an angle θm of the incident beam should be properly evaluated, in order to effectively guide the optical beam.

As described in the foregoing, however, the prior art method for fabricating the grating coupler includes a complicated manufacturing process such as the masking and photo lithography, and requires a long manufacturing time. In particular, therefore, in case of fabricating the grating coupler into a small semiconductor chip, such prior art method including the masking and etching (or photo lithography) process is not proper.

Meanwhile, if the optical waveguide has a plane surface, the incident beam from the exterior can not be effectively guided within the optical waveguide. Thus, such optical waveguide having a plane surface is not suitable for the coupler. Therefore, a coupler including the grating on the surface thereof is one of the solutions proposed for settling the problem. Here, the term "coupler" used in the application refers to an optical element for transferring an optical beam propagating in a particular medium to another medium. In order to transfer energy from the optical beam to a particular waveguide mode accurately, a propagation constant in the particular medium should be identical to a propagation constant in a medium to which the optical beam is transferred.

As illustrated in FIG. 1, the incident beam partially reflects on the surface of the grating 3 formed on the surface of the optical waveguide layer 2, and partially penetrates into the optical waveguide layer 2 via the grating 3. Thus, in the case where the propagation constant in the grating 3 is identical to the propagation constant in the optical waveguide layer 2 and a critical angle θm is below a particular angle, the penetrated incident beam propagates only within the optical waveguide layer 2. This relationship can be represented by, $$\beta = \beta o + \upsilon 2\pi/\Delta$$

Where $\beta$ is a propagation constant of the optical beam within the optical waveguide layer 2 neighbored upon a lower part of the grating layer 3, $\beta o$ is a propagation constant at the optical waveguide layer 2 without the grating layer 3, $\upsilon$ is an integer, and $\Delta$ is the periodicity of the gratings. Then, a propagation constant $\beta m$ at a medium having a reflective index $n_3$ of the incident beam can be represented by, $$\beta m = k n_3 \sin \theta m$$

where k is a propagation constant under vacuum which is identical to $2\pi/\lambda o$ ($\lambda o$ is a wavelength of the incident beam under vacuum), $\theta m$ is the maximum incident angle. Here, when $\beta$ is identical to $\beta m$, the penetrated incident beam propagates only within the optical waveguide layer 2.

SUMMARY OF THE INVENTION

It is therefore an object of the present invention to provide a method for fabricating a grating coupler having an epitaxial layer of which surface has a cross-hatch pattern that serves as the grating, in which the cross-hatch pattern is formed simultaneously while growing the epitaxial layer by an epitaxial growing process.

According to an aspect of the present invention, a substrate is first formed, and then an optical waveguide layer is grown on the substrate by an epitaxial growing process such as a metalorganic chemical vapor deposition and a molecular beam deposition. The optical waveguide layer has a surface on which a cross-hatch pattern serving as the grating is continuously formed.

The optical waveguide layer is formed with a material having a reflective index greater than a reflective index of the substrate or an atmosphere. Specifically, the substrate is formed with GaAs and the optical waveguide layer is formed with InGaAs. Further, the substrate is an on-substrate having an orientation coinciding with a [100] plane, so as to form the optical waveguide layer having continuous cross-hatch patterns on the surface thereof. The spacing between the cross-hatch patterns can be varied according to variation of a growth temperature of the optical waveguide layer.

BRIEF DESCRIPTION OF THE DRAWINGS

The above and other objects, features and advantages of the present invention will become more apparent in the light of the following detailed description of an exemplary embodiment thereof taken with the attached drawings in which.

DETAILED DESCRIPTION OF THE PREFERRED EMBODIMENT

A preferred embodiment of the present invention will be described in detail hereinbelow with reference to the attached drawings.

Figure 2:
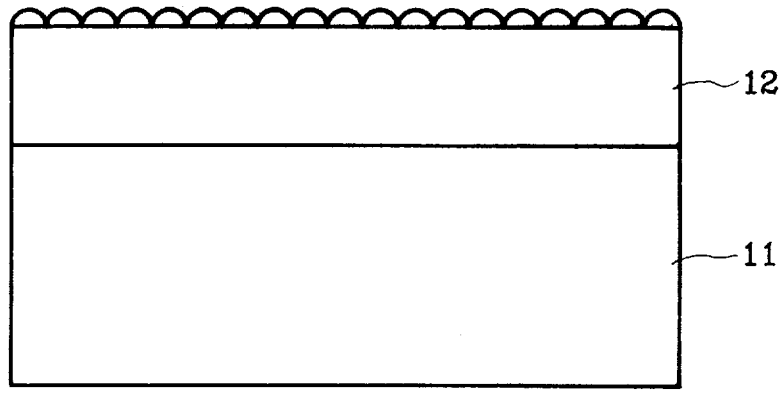
FIG. 2 is a cross-sectional view of a grating coupler according to a preferred embodiment of the present invention.

Referring to FIG. 2, an optical waveguide layer 12 is formed on a substrate 11 by an epitaxial growing process.

The optical waveguide layer 12 is an epitaxial layer having the surface on which a plurality of cross-hatch patterns are formed uniformly. The optical waveguide layer 12 is formed with a material having a reflective index greater than that of the substrate 11. For example, if the substrate is formed with gallium arsenide (GaAs), the optical waveguide layer 12 will be formed with indium gallium arsenide (InGaAs).

The InGaAs epitaxial layer 12 is grown by a metalorganic chemical vapor deposition (MOCVD) using commercialized manufacturing equipments, so as to form the cross-hatch pattern on the surface thereof according to the present invention. Alternatively, the InGaAs epitaxial layer 12 can also be grown by a molecular beam deposition. The grating coupler which is commonly used for an optical transmission system, is fabricated by an epitaxial growing process according to the present invention. Therefore, according to the present invention, the complicated conventional process for fabricating the grating may be eliminated, so that the optical waveguide layer 12 can be formed by a simple process. It should be noted that the cross-hatch pattern which serves as the grating is formed simultaneously while growing the optical waveguide layer 12, according to the present invention.

As described in the foregoing, in order to transfer energy from the light beam to a particular waveguide mode accurately, a propagation constant in a particular medium should be identical to a propagation constant in a medium to which the optical beam is transferred. Further, the related equation also has been expressed hereinabove. In realizing such principle, the grating plays an important role. In the present invention, the epitaxial growing process is used for forming the cross-hatch pattern that serves as the grating.

Figure 1:
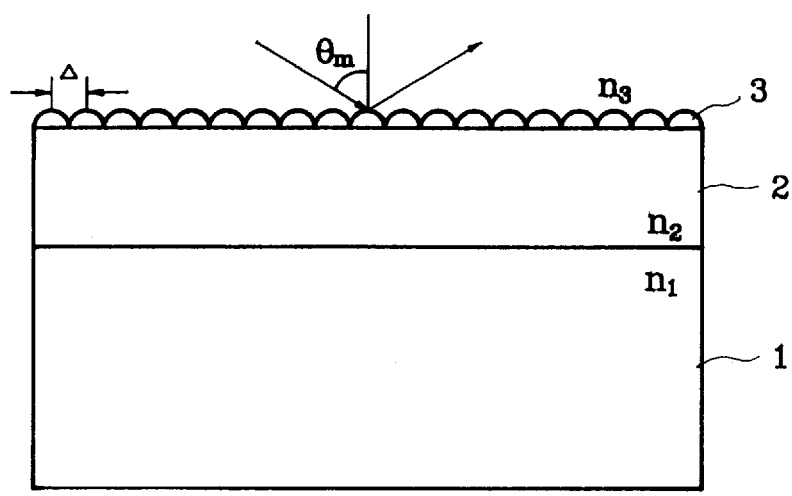
FIG. 1 is a cross-sectional view of a grating coupler according to the prior art.
Figure 3:
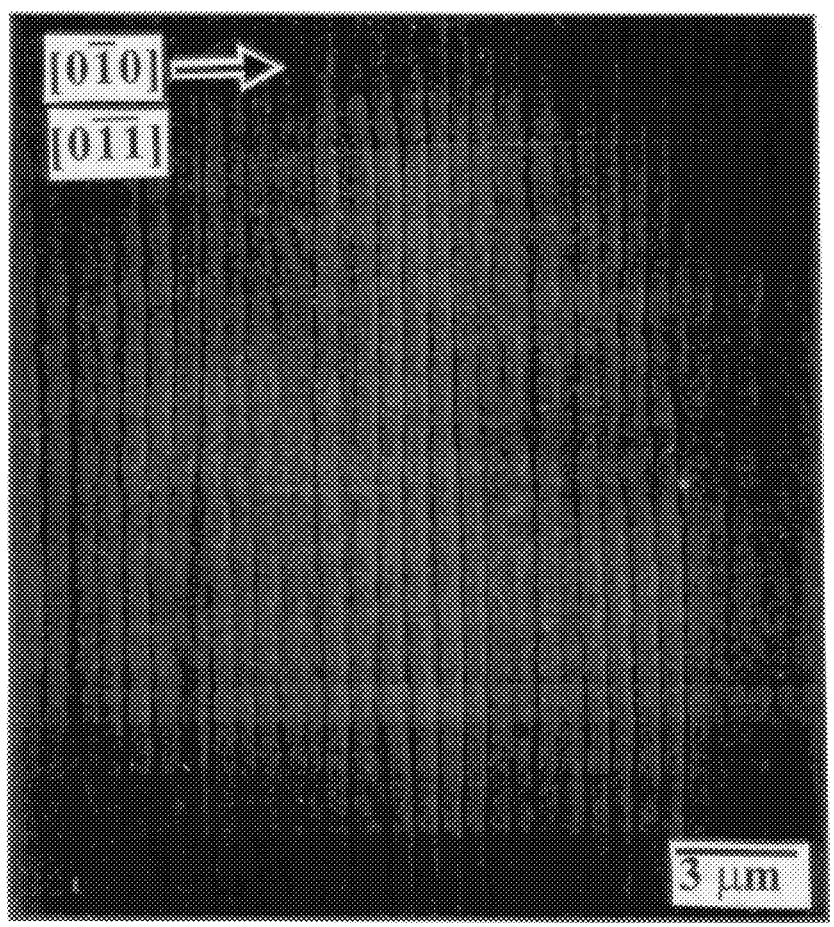
FIG. 3 is a photograph showing a cross-hatch pattern formed on the surface of the epitaxial layer as shown in FIG. 2.

Referring to FIG. 3, there is illustrated a photograph showing the cross-hatch pattern formed on the surface of the InGaAs epitaxial layer 12. The photograph has been taken by an electron microscope. Specifically, the InGaAs epitaxial layer 12 with indium (In) of 12% is formed on a GaAs layer 12A by the metalorganic chemical vapor deposition (MOCVD) which is a kind of the epitaxial growing process. In the photograph, the cross-hatch pattern has appeared on the surface, because a lattice constant of the InGaAs epitaxial layer 12 is greater than the lattice constant of the GaAs substrate 11. The numerals [010] and [011] appearing on the left side on the top of the photograph refer to orientations of the surface of the GaAs substrate 11, respectively. Here, the cross-hatch pattern appearing on the surface of the InGaAs epitaxial layer 12 is the optical waveguide layer 12 which serves as the grating 3 of the prior art grating coupler shown in FIG. 1.

More specifically, the photograph shown in FIG. 3 expresses the $In_{0.12}Ga_{0.88}As$ epitaxial layer 12 with indium (In) of 12% having a thickness of about 2.5 $\mu$m, which is formed on the GaAs substrate 11 by the metalorganic chemical vapor deposition (MOCVD), a kind of the epitaxial growing process. The cross-hatch pattern appearing on the surface of the InGaAs epitaxial layer 12 may be formed by selecting the growing condition properly. First, the reason that the InGaAs is used for forming such cross-hatch pattern is because the reflective index of the InGaAs epitaxial layer 12 is greater than the reflective index of the GaAs substrate 11 or the atmosphere. Thus, it is possible to use the InGaAs epitaxial layer 12 as the optical waveguide layer. In order to form the cross-hatch pattern, the lattice constant of the InGaAs epitaxial layer 12 should be greater than the lattice constant of the GaAs substrate 11. Accordingly, the InGaAs is a material suitable for the optical waveguide layer 12 to be formed on the GaAs substrate 11. A so-called off-substrate which has an orientation deviated by about 2° from an orientation [100] plane is conventionally used for the GaAs substrate 11. If using such conventional off-substrate, the cross-hatch pattern is formed discontinuously at every joint thereof according to the experiment, thereby causing the InGaAs epitaxial layer 12 not to play the role of the grating.

However, if using a so-called on-substrate which has an orientation coinciding with the orientation [100] plane, the cross-hatch pattern is formed uniformly continuously as shown in FIG. 3 according to the experiment. Furthermore, according to the experiment, the spacing (or periodicity) between the cross-hatch patterns is about 0.3 $\mu$m, which is measured to be suitable for the optical waveguide at a visible ray region. The spacing between the cross-hatch patterns can be freely varied according to the growth temperature of the InGaAs epitaxial layer 12. In practice, the spacing between the cross-hatch patterns should be adjusted according to the wavelength of the optical beam to be guided. In the present invention, the spacing between the cross-hatch patterns is controlled by adjusting the growth temperature of the InGaAs epitaxial layer 12.

As described in the foregoing, the present invention forms the cross-hatch pattern on the InGaAs epitaxial layer 12 simultaneously while growing the InGaAs epitaxial layer 12 to be used for the optical waveguide layer, so that the feature of InGaAs epitaxial layer 12 may be freely controlled. In this way, the conventionally used complicated grating fabricating process can be eliminated. Accordingly, the present invention has the advantage of reducing the manufacturing time and cost.

Although various preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for fabricating a grating coupler, comprising the steps of:

forming a substrate;

growing an optical waveguide layer on said substrate, said optical waveguide layer having a surface on which a cross-hatch pattern which serves as a grating is continuously formed by an epitaxial growing process; and controlling a spacing of the cross-hatch pattern by varying a growth temperature during said step of growing an optical waveguide layer.

2. A method for fabricating a grating coupler according to claim 1, wherein said optical waveguide layer is formed with a material having a reflective index greater than a reflective index of said substrate or an atmosphere.

3. A method for fabricating a grating coupler according to claim 1, wherein said substrate is formed with GaAs and said optical waveguide layer is formed with InGaAs which has a reflective index and a lattice constant greater than the reflective index and lattice constant of said GaAs, so as to form the cross-hatch pattern on the surface of the optical waveguide layer.

4. A method for fabricating a grating coupler according to claim 1, wherein said substrate is an on-substrate having an orientation coinciding with a [100] plane, so as to form the optical waveguide layer having continuous cross-hatch patterns on the surface thereof.

5. A method for fabricating a grating coupler according to claim 1, wherein said epitaxial growing process is a metalorganic chemical vapor deposition or a molecular beam deposition.

* * * * *